United States Patent
Lim

(10) Patent No.: US 8,953,377 B2
(45) Date of Patent: Feb. 10, 2015

(54) NONVOLATILE MEMORY DEVICE AND DATA STORAGE DEVICE INCLUDING THE SAME

(71) Applicant: SK Hynix Inc., Icheon-si Gyeonggi-do (KR)

(72) Inventor: Sang O Lim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/779,252

(22) Filed: Feb. 27, 2013

(65) Prior Publication Data

US 2014/0063948 A1 Mar. 6, 2014

(30) Foreign Application Priority Data

Sep. 4, 2012 (KR) .................... 10-2012-0097786

(51) Int. Cl.
*G11C 11/34* (2006.01)
*G11C 16/06* (2006.01)

(52) U.S. Cl.
CPC .................................... *G11C 16/06* (2013.01)
USPC .................................................. 365/185.11

(58) Field of Classification Search
CPC ........... G11C 7/10; G11C 16/06; G11C 16/10
USPC ................. 365/185.11, 185.28, 236
See application file for complete search history.

(56) References Cited

U.S. PATENT DOCUMENTS

| | | | | |
|---|---|---|---|---|
| 7,725,694 | B2 * | 5/2010 | Ito et al. | 712/234 |
| 2005/0185468 | A1 * | 8/2005 | Hosono et al. | 365/185.22 |
| 2006/0077720 | A1 * | 4/2006 | Im | 365/185.28 |
| 2006/0114730 | A1 * | 6/2006 | Lee et al. | 365/189.05 |
| 2007/0147133 | A1 * | 6/2007 | Im | 365/185.28 |
| 2007/0150646 | A1 * | 6/2007 | Yoon et al. | 711/103 |
| 2008/0151641 | A1 * | 6/2008 | Park et al. | 365/185.23 |
| 2008/0192540 | A1 * | 8/2008 | Kong et al. | 365/185.03 |
| 2010/0149870 | A1 * | 6/2010 | Shirota | 365/185.03 |
| 2010/0215335 | A1 * | 8/2010 | Murashige | 386/68 |
| 2011/0019471 | A1 * | 1/2011 | Cernea | 365/185.03 |
| 2011/0228588 | A1 * | 9/2011 | Kim et al. | 365/148 |
| 2012/0321032 | A1 * | 12/2012 | Liu et al. | 377/26 |

FOREIGN PATENT DOCUMENTS

| | | | |
|---|---|---|---|
| KR | 1020060032507 | A | 4/2006 |
| KR | 1020090068617 | A | 6/2009 |

* cited by examiner

*Primary Examiner* — Hoai V Ho
*Assistant Examiner* — Pablo Huerta
(74) *Attorney, Agent, or Firm* — William Park & Associates Patent Ltd.

(57) ABSTRACT

A nonvolatile memory device includes: a plurality of memory cells arranged in a region where word lines and bit lines intersect, a data read/write circuit including a plurality of latches configured to temporarily store data inputted from an external device, and configured to perform a program operation on the memory cells based on data stored in the latches, and a skip data control unit configured to determine whether data to be programmed into the memory cells are available, and to store program-inhibit data in a latch corresponding to a memory cell which is determined to not contain any data.

19 Claims, 9 Drawing Sheets

NONVOLATILE MEMORY DEVICE AND DATA STORAGE DEVICE INCLUDING THE SAME

CROSS-REFERENCES TO RELATED APPLICATION

The present application claims priority under 35 U.S.C. §119(a) to Korean application number 10-2012-0097786, filed on Sep. 4, 2012, in the Korean Intellectual Property Office, which is incorporated herein by reference in its entirety.

BACKGROUND

1. Technical Field

The present invention relates generally to a semiconductor memory device, and more particularly, to a nonvolatile memory device and a data storage device including the same.

2. Related Art

In general, a semiconductor memory device is classified into a volatile memory device or a nonvolatile memory device. The volatile memory device loses data stored therein when the power supply is removed, and the nonvolatile memory device maintains data stored therein even though the power supply is removed. The nonvolatile memory device may include various types of memory cells.

The nonvolatile memory device may be further classified into a flash memory device, a ferroelectric RAM (FRAM) using a ferroelectric capacitor, a magnetic RAM (MRAM) using a tunneling magneto-resistive (TMR) layer, a phase change memory device using chalcogenide alloys, a resistive RAM (ReRAM) using transition metal oxide and the like, depending on the structure of memory cells.

Among the nonvolatile memory devices, the flash memory device is typically classified into a NOR flash memory device and a NAND flash memory device, depending on the connection state between memory cells and a bit line. The NOR flash memory device has a structure in which two or more memory cell transistors are connected in parallel to one bit line, which leads to it having excellent random access time characteristics. On the other hand, the NAND flash memory device has a structure in which two or more memory cell transistors are connected in series to one bit line. Such a structure is referred to as a cell string, and one bit line contact is required per one cell string. Such structure allows the NAND flash memory device to have excellent integration capabilities.

Among the nonvolatile memory devices, the flash memory device performs a program or read operation in a page-wise manner, where one page is defined as a plurality of memory cells, due to the structural characteristics thereof. Memory cells forming one page may be accessed according to column addresses. Data may or may not be stored in memory cells corresponding to some column addresses. However, since latches of data read/write circuits corresponding to the memory cells that may or may not have data stored therein are collectively reset regardless of whether data is stored, the current or time required for the program operation may increase.

SUMMARY

A nonvolatile memory device capable of scanning for data not stored in memory cells (hereinafter referred to as skipped data) and setting a data write circuit according to a scan result and a data storage device including the same are described herein.

In an embodiment of the present invention, a nonvolatile memory device includes: a plurality of memory cells arranged in a region where word lines and bit lines intersect, a data read/write circuit including a plurality of latches configured to temporarily store data inputted from an external device, and configured to perform a program operation on the memory cells based on data stored in the latches, and a skip data control unit configured to determine whether data to be programmed into the memory cells are available, and to store program-inhibit data in a latch corresponding to a memory cell which is determined to not contain any data.

In another embodiment of the present invention, a data storage device includes: a nonvolatile memory device, and a controller configured to control the nonvolatile memory device. The nonvolatile memory device includes: a plurality of memory cells arranged in a region where word lines and bit lines intersect, a data read/write circuit including a plurality of latches configured to store data inputted from an external device, and configured to perform a program operation on the memory cells based on data stored in the latches, and a skip data control unit configured to determine whether data to be programmed into the memory cells exist, and to store program-inhibit data in a latch corresponding to a memory cell which is determined to not contain any data.

BRIEF DESCRIPTION OF THE DRAWINGS

Features, aspects, and embodiments are described in conjunction with the attached drawings, in which.

DETAILED DESCRIPTION

Hereinafter, a nonvolatile memory device and a data storage device including the same according to the present invention will be described below with reference to the accompanying drawings through various embodiments.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

Figure 1:
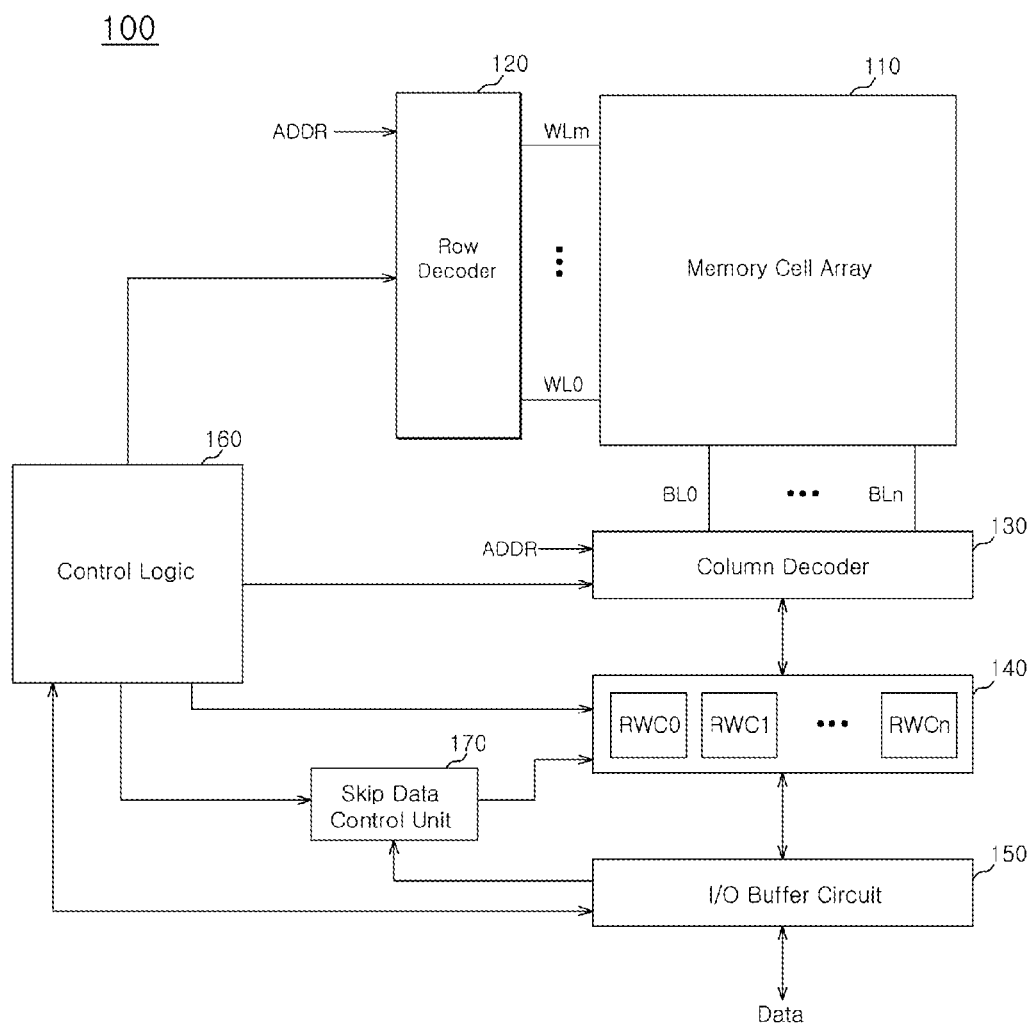
FIG. 1 is a block diagram illustrating a nonvolatile memory device according to an embodiment of the present invention.

FIG. 1 is a block diagram illustrating a nonvolatile memory device according to an embodiment of the present invention. Referring to FIG. 1, the nonvolatile memory device 100 includes a memory cell array 110, a row decoder 120, a column decoder 130, a data read/write circuit 140, an input/output (I/O) buffer circuit 150, a control logic 160, and a skip data control unit 170.

The memory cell array 110 includes a plurality of memory cells arranged at the respective intersections between bit lines BL0 to BLn and word lines WL0 to WLm. The memory cells are programmed in a page-wise manner and erased in a block-wise manner, due to the structural characteristics thereof. A page indicates a unit for grouping memory cells to perform a program or read operation, and a block indicates a unit for grouping memory cells to perform an erase operation. One memory block may include a plurality of pages.

Each memory cell may be referred to as a single level cell (SLC), and may store one-bit data. The SLC is programmed in such a manner as to have a threshold voltage corresponding to an erase state and one program state. As another example, each memory cell may be referred to as a multi-level cell (MLC), and may store two or more bits of data. The MLC is programmed in such a manner as to have a threshold voltage corresponding to an erase state and any one of a plurality of program states. Accordingly, the memory cell array 110 may be implemented to have a single-layer array structure, referred to as a 2D array structure, or a multi-layer array structure, which is referred to as a 3D structure.

The row decoder 120 operates according to the control of the control logic 160. The row decoder 120 is connected to the memory cell array 110 through the plurality of word lines WL0 to WLm, and is configured to decode an address ADDR inputted from an external source. The row decoder 120 is configured to selectively drive the word lines WL0 to WLm according to the decoding result.

The column decoder 130 operates according to the control of the control logic 160. The column decoder 130 is connected to the memory cell array 110 through the bit lines BL0 to BLn. The column decoder 130 is configured to decode the address ADDR and to sequentially connect the bit lines BL0 to BLn to the data read/write circuit 140 by a predetermined unit according to the decoding result.

The data read/write circuit 140 operates according to the control of the control logic 160. The data read/write circuit 140 is configured to operate as a write driver or sense amplifier depending on an operation mode. For example, the data read/write circuit 140 is configured to store data inputted through the I/O buffer circuit 150 in memory cells of the memory cell array 110 during a program operation. As another example, the data read/write circuit 140 is configured to output data read from memory cells of the memory cell array 110 to the I/O buffer circuit 150 during a read operation.

The data read/write circuit 140 may include a plurality of data read/write circuits RWC0 to RWCn corresponding to the respective bit lines BL0 to BLn (or bit line pairs). For this reason, the bit lines BL0 to BLn (or bit line pairs) may be selected or controlled by the corresponding data read/write circuits RWC0 to RWCn.

The I/O buffer circuit 150 is configured to receive data from an external device (for example, a memory controller, a memory interface, a host device or the like) or output data to the external device. The I/O output buffer circuit 150 may include a data latch circuit (not illustrated) and an output driving circuit (not illustrated).

The control logic 160 is configured to control overall operations of the nonvolatile memory device 100 in response to control signals provided from an external device. For example, the control logic 160 may control read, program (or write), and erase operations of the nonvolatile memory device 100. The control logic 160 controls the particular data read/write circuits to which data to be programmed are not inputted, by the skip data control unit 170 during a program operation. Such a control operation is defined as a skip data control operation. Hereafter, the skip data control operation will be described in detail.

The skip data control unit 170 is configured to perform a skip data control operation according to the control of the control logic 160. The skip data control operation includes a skip data scan operation and a skip latch setting operation of setting latches of the data read/write circuits according to a scan result.

Memory cells forming one page may be accessed according to column addresses. As described above, data may or may not be stored in memory cells corresponding to some column addresses. In order to input data to store in a memory cell, a column address for accessing the corresponding memory cell is provided. An operation of determining column addresses provided during a program operation and then determining memory cells in which data is not stored is defined collectively as a skip data scan operation.

A data read/write circuit must program-inhibit any memory cell that does not contain data. In order for the data read/write circuit to program-inhibit a memory cell, a latch of the data read/write circuit, which temporarily stores input data, must be set to a specific value (for example, program-inhibit data). The latch of the data read/write circuit, in which data to be programmed is not stored therein since the data was not provided from an external device, is defined as a skip latch. An operation of setting a skip latch to a specific value (for example, program-inhibit data) is defined as a skip latch setting operation.

According to an embodiment of the present invention, a data read/write circuit may selectively program-inhibit memory cells in which data to be programmed is not provided. That is, a memory cell in which data is not stored may be determined through a skip data scan operation, and program-inhibit data may be stored only in a latch of a data read/write circuit corresponding to the memory cell. Therefore, an operation of collectively resetting all of the data read/write circuits regardless of whether data to be programmed are provided is not performed. In turn, current or time required for a program operation may be reduced.

Figure 2:
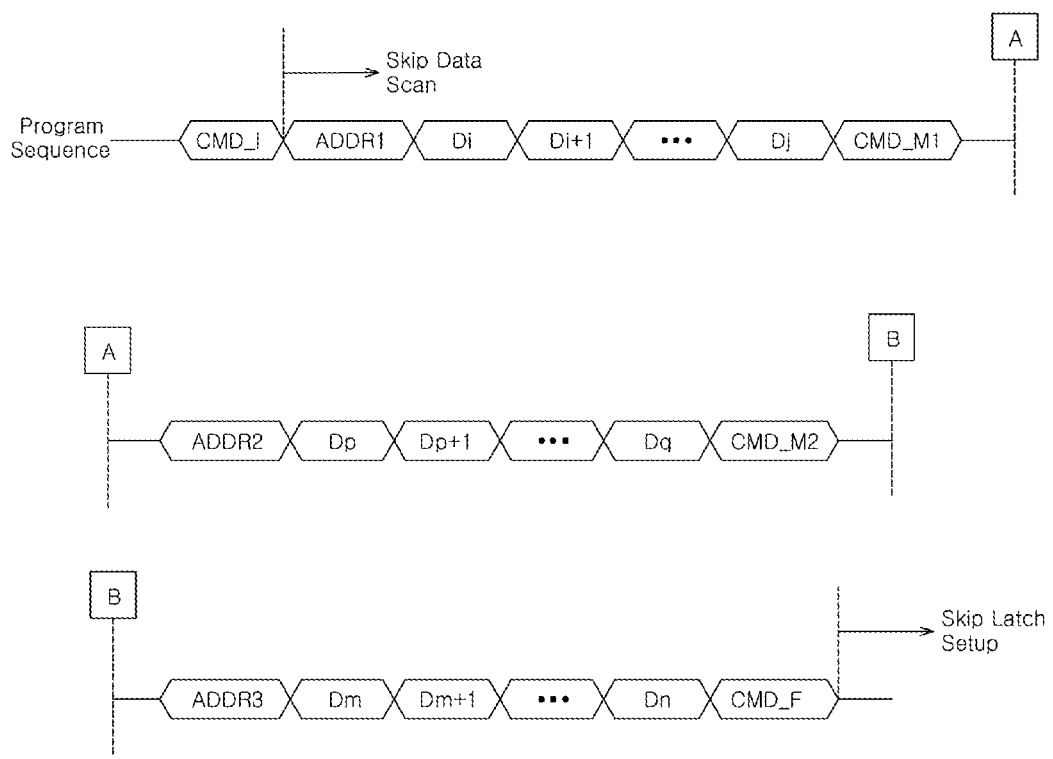
FIG. 2 is a diagram illustrating a program procedure of the nonvolatile memory device according to an embodiment of the present invention.
Figure 3:
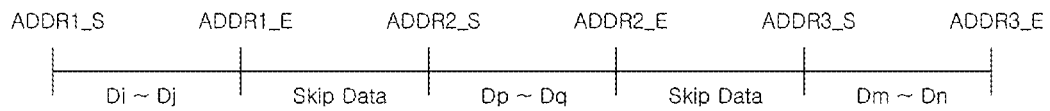
FIG. 3 is a diagram illustrating skipped data according to an embodiment of the present invention.

FIG. 2 is a diagram illustrating a program procedure of the nonvolatile memory device according to an embodiment of the present invention. FIG. 3 is a diagram illustrating skipped data according to an embodiment of the present invention. Referring to FIGS. 2 and 3, a program procedure for when data is both stored and not stored in memory cells corresponding to some column addresses will be described in detail. Furthermore, addresses and input data will be described in detail.

A first command CMD_I, a first address ADDR1, and data Di to Dj are sequentially programmed into the nonvolatile memory device 100 of FIG. 1. The first command CMD_I is a command for setting the nonvolatile memory device to enter a program operation mode. The first address ADDR1 includes a column address of a memory cell in which the data Di is to be stored. The first address ADDR1 indicates a start address ADDR1_S (referred to in FIG. 3) of memory cells in which the data Di to Dj are to be stored.

The data Di to Dj are provided whenever a write control signal (for example, a write enable signal WE) toggles. The data Di is stored in a memory cell corresponding to the first address ADDR1, and the other data Di+1 to Dj are stored in memory cells corresponding to addresses which are increased based on the first address ADDR1, whenever the write control signal toggles.

After the first command CMD_I is provided, the skip data control unit 170 of FIG. 1 starts a skip data scan operation. That is, as shown in FIG. 3, the skip data control unit 170 determines the first start address ADDR1_S and a first end address ADDR1_E pertaining to the addresses at which the data Di to Dj are to be stored.

A second command CMD_M1, a second address ADDR2, and data Dp to Dq are sequentially provided to the nonvolatile memory device 100. The second command CMD_M1 is a command for additionally setting addresses of memory cells in which the data Dp to Dq are to be stored. The second address ADDR2 includes a column address of a memory cell in which data Dp is to be stored. The second address ADDR2 indicates a start address ADDR2_S (referred to in FIG. 3) of memory cells in which the data Dp to Dq are to be stored.

The data Dp to Dq are provided whenever a write control signal (for example, a write enable signal WE) toggles. The data Dp is stored in a memory cell corresponding to the second address ADDR2, and the other data Dp+1 to Dq are stored in memory cells corresponding to addresses which are increased based on the second address ADDR2, whenever the write control signal toggles.

The skip data control unit 170 performs a skip data scan operation according to a write control signal which is provided to input the second address ADDR2 and the data Dp to Dq. That is, as shown in FIG. 3, the skip data control unit 170 determines the second start address ADDR2_S and a second end address ADDR2_E pertaining to the addresses at which the data Dp to Dq are to be stored.

A third command CMD_M2, a third address ADDR3, and data Dm to Dn are sequentially provided to the nonvolatile memory device 100. The third command CMD_M2 is a command for additionally setting addresses of memory cells in which the data Dm to Dn are to be stored. The third address ADDR3 includes a column address of a memory cell in which the data Dm is to be stored. The third address ADDR3 indicates a start address ADDR3_S (referred to in FIG. 3) of memory cells in which the data Dm to Dn are to be stored.

The data Dm to Dn are provided whenever the write control signal (for example, the write enable signal WE) toggles. The data Dm is stored in a memory cell corresponding to the third address ADDR3, and the other data Dm+1 to Dn are stored in memory cells corresponding to addresses which are increased based on the third address ADDR3 whenever the write control signal toggles.

The skip data control unit 170 performs a skip data scan operation according to the third address ADDR3 and the write control signal which is provided to input the data Dm to Dn. That is, as shown in FIG. 3, the skip data control unit 170 determines the third start address ADDR3_S and a third end address ADDR3_E pertaining to the addresses at which the data Dm to Dn are to be stored.

When the addresses ADDR1_S, ADDR1_E, ADDR2_S, ADDR2_E, ADDR3_S, and ADDR3_E of the memory cells in which the data is to be stored are determined according to the addresses ADDR1, ADDR2, and ADDR3 provided during the program operation, the addresses of memory cells in which data is not stored may also be determined. As shown in FIG. 3, data is not stored in memory cells corresponding to addresses included in a range from the first end address ADDR1_E to the second start address ADDR2_S and a range from the second end address ADDR2_E to the third start address ADDR3_S. That is, data to be stored in the memory cells are skipped in regards to the addresses in the ranges described.

After all of the data to be programmed are provided, a fourth command CMD_F is provided to the nonvolatile memory device 100. The fourth command CMD_F is a command for controlling a substantial operation of applying a program voltage to store data in a memory cell. After the fourth command CMD_F is provided, the skip data control unit 170 performs a setting operation for a skip latch.

Figure 4:
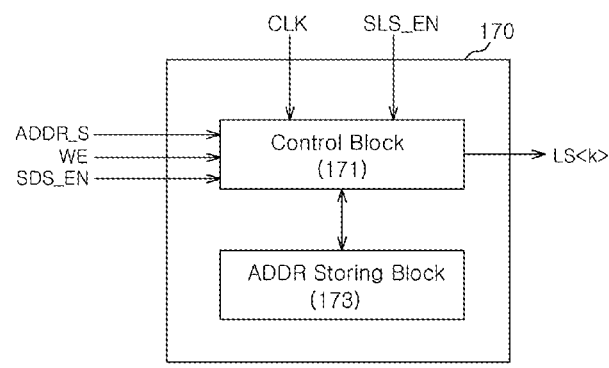
FIG. 4 is a block diagram of a skip data control unit according to an embodiment of the present invention.

FIG. 4 is a block diagram of the skip data control unit according to an embodiment of the present invention. Referring to FIG. 4, the skip data control unit 170 includes a control block 171 and an address storing block 173.

The control block 171 performs a skip data scan operation in response to a skip data scan signal SDS_EN which is activated after a command for setting the nonvolatile memory device to enter the program operation mode is provided. The control block 171 is configured to determine addresses of memory cells in which data is to be stored and not stored according to a start address ADDR_S and a write control signal WE provided to input data. For example, the control block 171 may count the toggle number of the write control signal WE, and add the counted toggle number to the start address ADDR_S to calculate the end address ADDR_E of the memory cells in which data is to be stored. The other addresses excluding the start address ADDR_S and the end address ADDR_E of the memory cells in which data is to be stored are determined to be the addresses of the memory cells in which data is not stored. The control block 171 is configured to store the determined addresses in the address storing block 173.

The control block 171 performs a skip latch setting operation in response to a skip latch setting signal SLS_EN which is activated after a command for controlling a substantial program operation of applying a program voltage to store data in a memory cell is provided. The control block 171 is configured to generate a skip latch setting signal LS<k> for setting latches of data read/write circuits corresponding to a range from the start address to the end address of the memory cells in which data is not stored.

Figure 5:
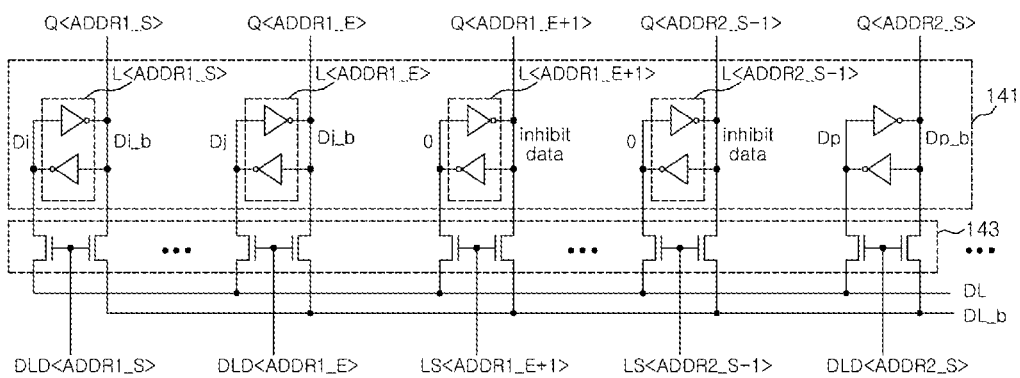
FIG. 5 is a circuit diagram illustrating a data read/write circuit controlled by the skip data control unit according to an embodiment of the present invention.

FIG. 5 is a circuit diagram illustrating a data read/write circuit controlled by the skip data control unit according to an embodiment of the present invention. FIG. 5 illustrates a plurality of latches 141 configured to temporarily store input data (that is, data to program) and a plurality of control circuits 143 corresponding to the latches 141, respectively, that are configured to set values which are to be stored in the latches 141. Referring to FIGS. 3 and 5, the skip latch setting operation will be described in detail.

Based on the values of specific nodes Q of the latches 141, corresponding memory cells may be programmed. Referring to FIG. 3, the data Di to Dj are stored in the memory cells corresponding to the addresses ADDR1_S to ADDR1_E. For this operation, inverted data Dib to Djb (or data Di to Dj) are stored in specific nodes Q<ADDR1_S> to Q<ADDR1_E> of latches L<ADDR1_S> to L<ADDR1_E>, respectively. The data Di to Dj and the inverted data Dib to Djb are stored in the corresponding latches L<ADDR1_S> to L<ADDR1_E>, respectively, when data loading signals DLD<ADDR1_S> to DLD<ADDR1_E> are activated.

Based on the values of specific nodes Q of the latches 141, corresponding memory cells may be program-inhibited. Referring to FIG. 3, since data is not inputted to memory cells corresponding to addresses ADDR1_E+1 to ADDR2_S−1, no data is stored in the memory cells. Therefore, program-inhibit data is stored in the specific nodes Q<ADDR1_E+1> to Q<ADDR2_S−1> of the latches L<ADDR1_E+1> to L<ADDR2_S−1>. The program-inhibit data is stored in the respective latches L<ADDR1_E+1> to L<ADDR2_S−1> corresponding to skip latch setting signals LS<ADDR1_E+1> to LS<ADDR2_S−1> provided from the skip latch control unit 170 of FIG. 1, when the skip latch setting signals LS<ADDR1_E+1> to LS<ADDR2_S−1> are activated. For example, the program-inhibit data may represent a logic high value as a digital value, and may represent a voltage greater than a ground voltage of 0V as an analog value.

According to an embodiment of the present invention, data read/write circuits to which data to be programmed is not inputted may be selectively program-inhibited. That is, memory cells in which data is not stored may be determined through the skip data scan operation, and program-inhibit data may be stored in latches of data read/write circuits corresponding to the memory cells. Therefore, the operation of collectively resetting all of the data read/write circuits regardless of whether data to be programmed are inputted is not performed.

Figure 6:
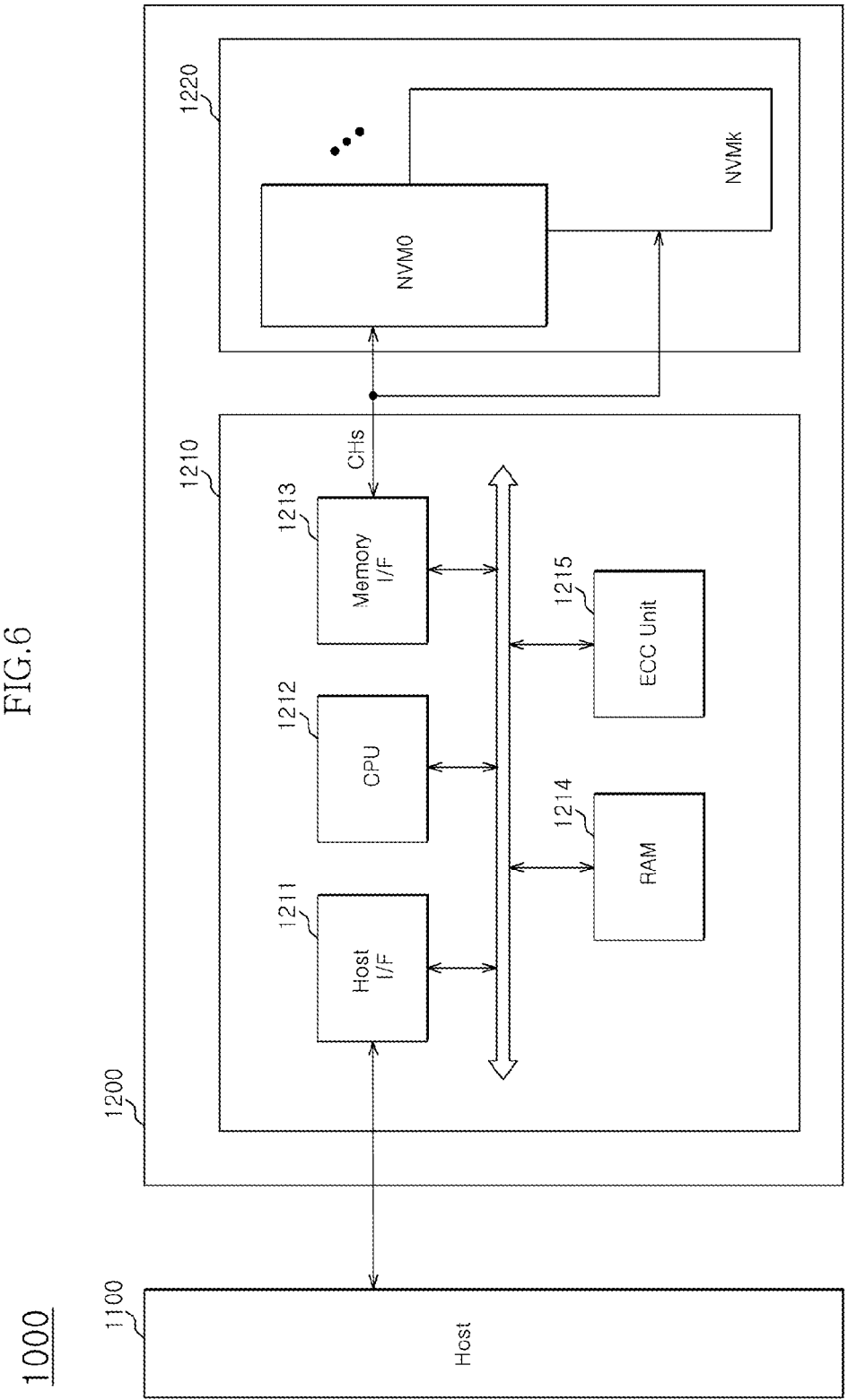
FIG. 6 is a block diagram illustrating a data processing system including the nonvolatile memory device according to an embodiment of the present invention.

FIG. 6 is a block diagram illustrating a data processing system including the nonvolatile memory device according to an embodiment of the present invention. Referring to FIG. 6, the data processing system 1000 includes a host 1100 and a data storage device 1200. The data storage device 1200 includes a controller 1210 and a data storage medium 1220. The data storage device 1200 may be connected to the host 1100 such as a desktop computer, a notebook computer, a digital camera, a mobile phone, an MP3 player, a game machine or the like. The data storage device 1200 is also referred to as a memory system.

The controller 1210 is connected to the host 1100 and the data storage medium 1220. The controller 1210 is configured to access the data storage medium 1220 in response to a request from the host 1100. For example, the controller 1210 is configured to control a read, program, or erase operation of the data storage medium 1220. The controller 1210 is configured to drive firmware for controlling the data storage medium 1220.

The controller 1210 may include well-known components such as a host interface 1211, a central processing unit (CPU) 1212, a memory interface 1213, a RAM 1214, and an error correction code (ECC) unit 1215.

The CPU 1212 is configured to control overall operations of the controller 1210 in response to a request by the host. The RAM 1214 may be used as a working memory of the CPU 1212. The RAM 1214 may temporarily store data read from the data storage medium 1220 or data provided from the host 1100.

The host interface 1211 is configured to interface the host 1100 and the controller 1210. For example, the host interface 1211 may be configured to communicate with the host 1100 through one of various interface protocols such as a USB (Universal Serial Bus) protocol, an MMC (Multimedia Card) protocol, a PCI (Peripheral Component Interconnection) protocol, a PCI-E (PCI-Express) protocol, a PATA (Parallel Advanced Technology Attachment) protocol, a SATA (Serial ATA) protocol, an SCSI (Small Computer System Interface) protocol, SAS (Serial SCSI), and an IDE (Integrated Drive Electronics) protocol.

The memory interface 1213 is configured to interface the controller 1210 with the data storage medium 1220. The memory interface 1213 is configured to provide a command and address to the data storage medium 1220. Furthermore, the memory interface 1213 is configured to exchange data with the data storage medium 1220.

The data storage medium 1220 may be configured with the nonvolatile memory device 100 of FIG. 1 according to the embodiment of the present invention. The data storage medium 1220 may include a plurality of nonvolatile memory devices NVM0 to NVMk. As the data storage medium 1220 is configured with the nonvolatile memory device 100 according to the embodiment of the present invention, the operating speed of the data storage device 1200 may be increased, and the current consumption of the data storage device 1200 may be reduced.

The ECC unit 1215 is configured to detect an error of the data read from the data storage medium 1220. Furthermore, the ECC unit 1215 is configured to correct the detected error, when the detected error falls within a correction range. The ECC unit 1215 may be provided externally or internally with respect to the memory system 1000.

The controller 1210 and the data storage medium 1220 may be configured as a solid state drive (SSD).

As another example, the controller 1210 and the data storage medium 1220 may be integrated into one semiconductor device to form a memory card. For example, the controller 1210 and the data storage medium 1220 may be integrated into one semiconductor device to form a PCMCIA (personal computer memory card international association) card, a CF (compact flash) card, a smart media card, a memory stick, a multi-media card (MMC, RS-MMC, or MMC-micro), an SD (secure digital) card (SD, Mini-SD, or Micro-SD), or a UFS (universal flash storage) card.

As another example, the controller 1210 or the data storage medium 1220 may be mounted in various types of packages. The controller 1210 or the data storage medium 1220 may be packaged and mounted according to various methods such as package on package (POP), ball grid arrays (BGAs), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat package (MQFP), thin quad flat package (TQFP), small outline IC (SOIC), shrink small outline package (SSOP), thin small outline package (TSOP), thin quad flat package (TQFP), system in package (SIP), multi chip package (MCP), wafer-level fabricated package (WFP), and wafer-level processed stack package (WSP).

Figure 7:
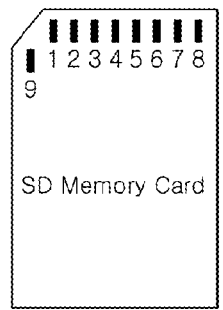
FIG. 7 illustrates a memory card including the nonvolatile memory device according to an embodiment of the present invention.

FIG. 7 illustrates a memory card including the nonvolatile memory device according to an embodiment of the present invention. FIG. 7 illustrates the exterior of an SD (secure digital) card among memory cards.

Referring to FIG. 7, the SD card includes one command pin (for example, second pin), one clock pin (for example, fifth pin), four data pins (for example, first, seventh, eighth, and ninth pins), and three power supply pins (for example, third, fourth, and sixth pins).

Through the command pin (second pin), a command and a response signal are transmitted. In general, the command is transmitted to the SD card from a host, and the response signal is transmitted to the host from the SD card.

The data pins (first, seventh, eighth, and ninth pins) are divided into receive (Rx) pins for receiving data transmitted from the host and transmit (Tx) pins for transmitting data to the host. The Rx pins and the Tx pins, respectively, form a pair to transmit differential signals.

The SD card includes the nonvolatile memory device 100 of FIG. 1 according to an embodiment of the present invention and a controller for controlling the nonvolatile memory device. The controller included in the SD card may have the same configuration and function as the controller 1210 described with reference to FIG. 6.

Figure 8:
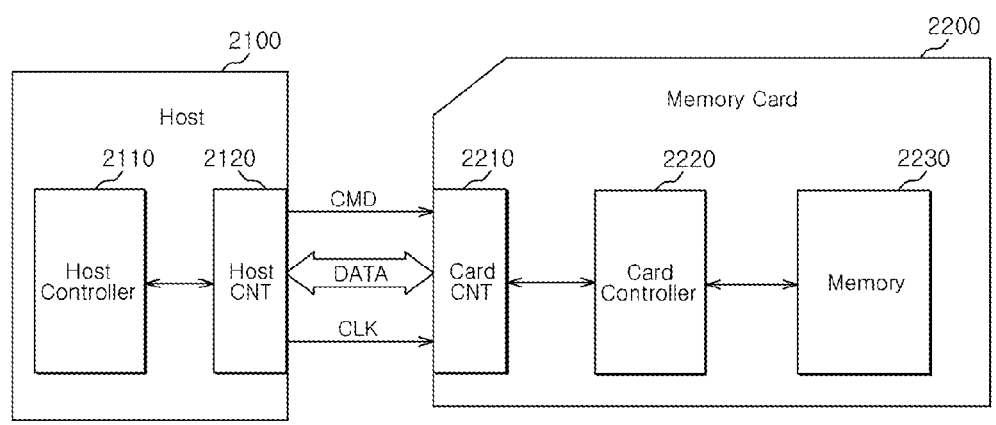
FIG. 8 is a block diagram illustrating the internal configuration of the memory card of FIG. 7 and the connection relation between the memory card and a host.

FIG. 8 is a block diagram illustrating the internal configuration of the memory card of FIG. 7 and the connection relation between the memory card and a host. Referring to FIG. 8, the data processing system 2000 includes a host 2100 and a memory card 2200. The host 2100 includes a host controller 2110 and a host connection unit 2120. The memory card 2200 includes a card connection unit 2210, a card controller 2220, and a memory device 2230.

The host connection unit 2120 and the card connection unit 2210 include a plurality of pins. The pins may include a command pin, a clock pin, a data pin, and a power supply pin. The number of pins may differ depending on the type of the memory card 2200.

The host 2100 stores data in the memory card 2200 or reads data stored in the memory card 2200.

The host controller 2110 transmits a write command CMD, a clock signal CLK generated from a clock generator (not illustrated) inside the host 2100, and data DATA to the memory card 2200 through the host connection unit 2120. The card controller 2220 operates in response to the write command received through the card connection unit 2210. The card controller 2220 stores the received data DATA in the memory device 2230, using a clock signal generated from a clock generator (not illustrated) inside the card controller 2220, according to the received clock signal CLK.

The host controller 2110 transmits a read command CMD and the clock signal CLK generated from the clock generator inside the host device 2100 to the memory card 2200 through the host connection unit 2120. The card controller 2220 operates in response to the read command received through the card connection unit 2210. The card controller 2220 reads data from the memory device 2230 using the clock signal generated from the clock generator inside the card controller 2220, according to the received clock signal CLK, and transmits the read data to the host controller 2110.

Figure 9:
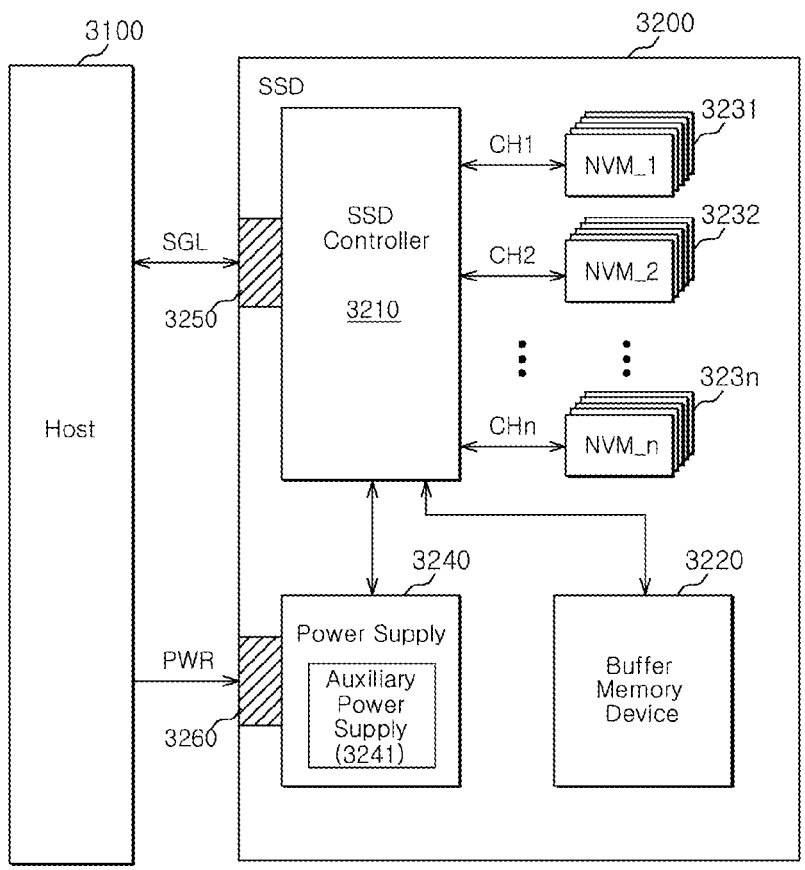
FIG. 9 is a block diagram illustrating a solid state drive (SSD) including the nonvolatile memory device according to an embodiment of the present invention.
Figure 11:
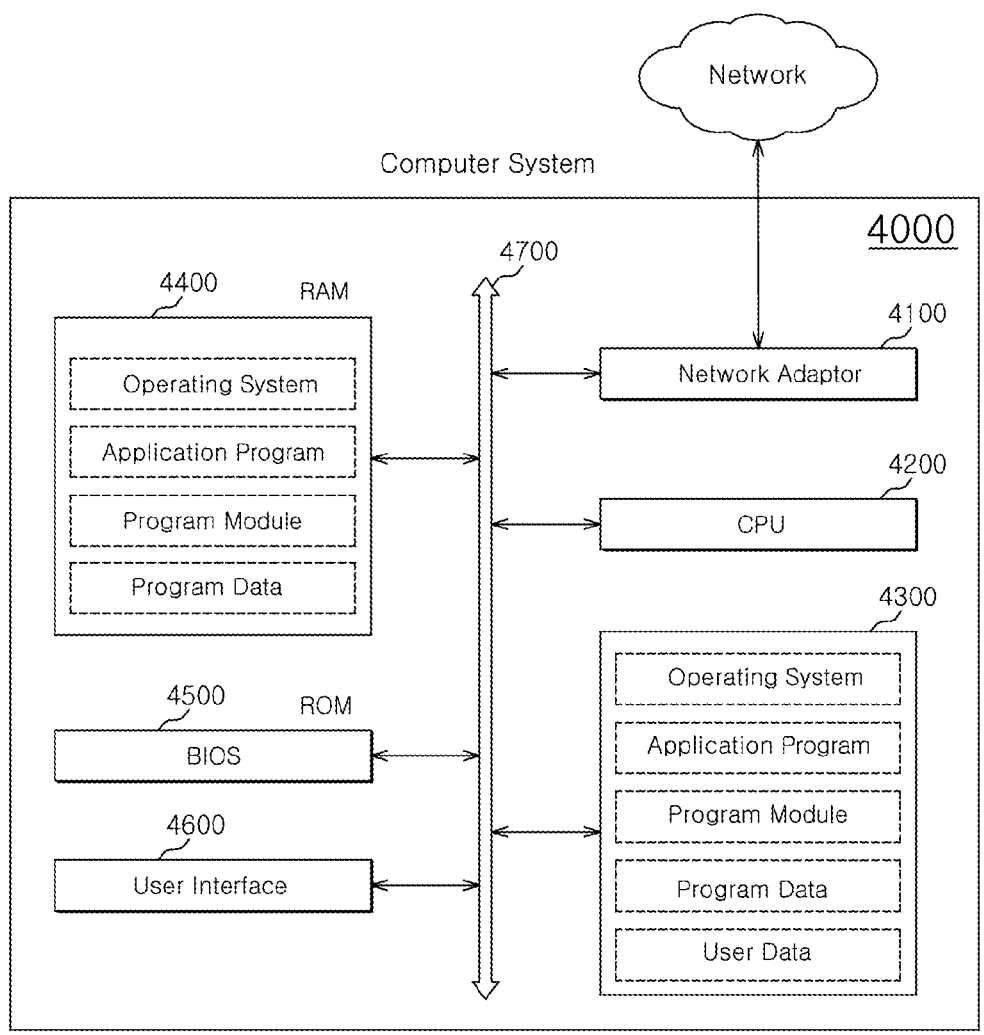
FIG. 11 is a block diagram illustrating a computer system in which a data storage device including the nonvolatile memory device according to an embodiment of the present invention is mounted.

FIG. 9 is a block diagram illustrating an SSD including the nonvolatile memory device according to an embodiment of the present invention. Referring to FIG. 11, a data processing system 3000 includes a host 3100 and an SSD 3200.

The SSD 3200 includes an SSD controller 3210, a buffer memory device 3220, a plurality of nonvolatile memory devices 3231 to 323n, a power supply 3240, a signal connector 3250, and a power connector 3260.

The SSD 3200 operates in response to a request by the host device 3100. That is, the SSD controller 3210 is configured to access the nonvolatile memory devices 3231 to 323n in response to a request from the host 3100. For example, the SSD controller 3210 is configured to control read, program, and erase operations of the nonvolatile memory devices 3231 to 323n.

The buffer memory device 3220 is configured to temporarily store data which are to be stored in the nonvolatile memory devices 3231 to 323n. Furthermore, the buffer memory device 3220 is configured to temporarily store data read from the nonvolatile memory devices 3231 to 323n. The data temporarily stored in the buffer memory device 3220 are transmitted to the host 3100 or the nonvolatile memory devices 3231 to 323n, according to the control of the SSD controller 3210.

The nonvolatile memory devices 3231 to 323n may be used as storage media of the SSD 3200. Each of the nonvolatile memory devices 3231 to 323n may include the nonvolatile memory device 100 of FIG. 1 according to the embodiment of the present invention. Therefore, the operating speed of the SSD 3200 may be increased, and the current consumption of the SSD 3200 may be reduced.

The respective nonvolatile memory devices 3231 to 323n are connected to the SSD controller 3210 through a plurality of channels CH1 to CHn. One channel may be connected to one or more nonvolatile memory devices. The nonvolatile memory devices connected to one channel may be connected to the same signal bus and data bus.

The power supply 3240 is configured to provide power PWR inputted through the power connector 3260 into the SSD 3200. The power supply 3240 includes an auxiliary power supply 3241. The auxiliary power supply 3241 is configured to supply power to normally terminate the SSD 3200, when power suddenly shuts off. The auxiliary power supply 3241 may include super capacitors capable of storing the power PWR.

The SSD controller 3210 is configured to exchange signals SGL with the host 3100 through the signal connector 3250. Here, the signals SGL may include commands, addresses, data and the like. The signal connector 3250 may include a connector such as PATA (Parallel Advanced Technology Attachment), SATA (Serial Advanced Technology Attachment), SCSI (Small Computer System Interface), or SAS (Serial SCSI), according to the interface method between the host 3100 and the SSD 3200.

Figure 10:
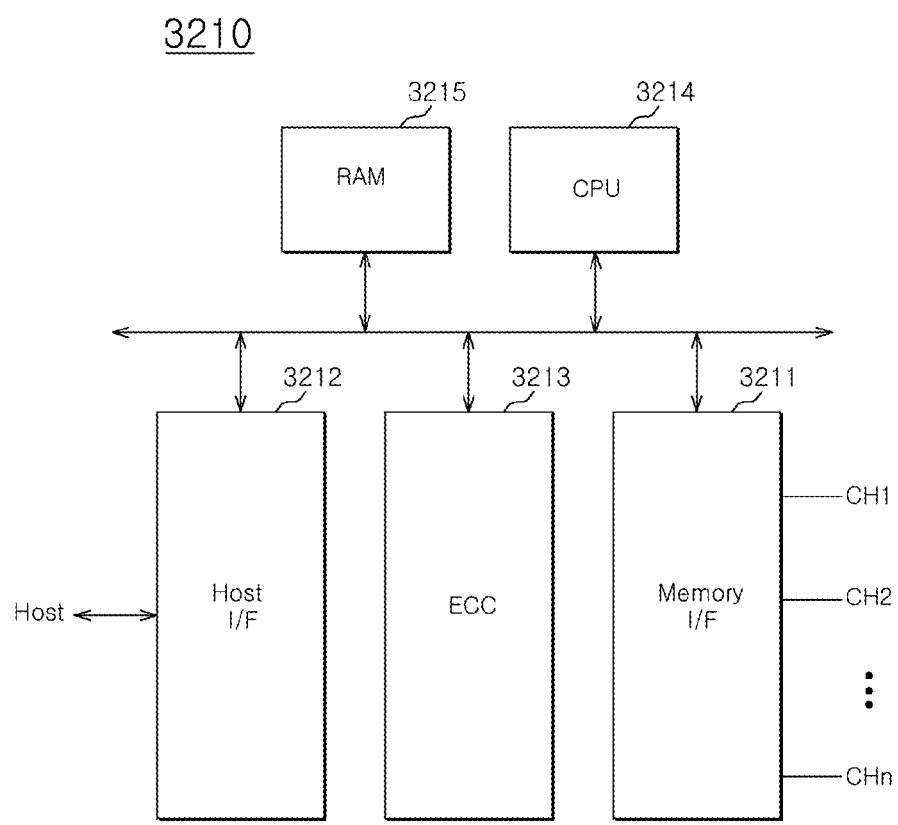
FIG. 10 is a block diagram illustrating an SSD controller of FIG. 9.

FIG. 10 is a block diagram illustrating the SSD controller of FIG. 9. Referring to FIG. 10, the SSD controller 3210 includes a memory interface 3211, a host interface 3212, an ECC unit 3213, a CPU 3214, and a RAM 3215.

The memory interface 3211 is configured to provide a command and address to the nonvolatile memory devices 3231 to 323n. Furthermore, the memory interface 3211 is configured to exchange data with the nonvolatile memory devices 3231 to 323n. The memory interface 3211 may scatter data transmitted from the buffer memory device 3220 over the respective channels CH1 to CHn, according to the control of the CPU 3214. Furthermore, the memory interface 3211 transmits data read from the nonvolatile memory devices 3231 to 323n to the buffer memory device 3220, according to the control of the CPU 3214.

The host interface 3212 is configured to provide an interface with the SSD 3200 in response to the protocol of the host 3100. For example, the host interface 3212 may be configured to communicate with the host 3100 through one of PATA (Parallel Advanced Technology Attachment), SATA (Serial Advanced Technology Attachment), SCSI (Small Computer System Interface), SAS (Serial SCSI) protocols. Furthermore, the host interface 3212 may perform a disk emulation function of supporting the host 3100 to recognize the SSD 3200 as a hard disk drive (HDD).

The ECC unit 3213 is configured to generate parity bits based on the data transmitted to the nonvolatile memory devices 3231 to 323*n*. The generated parity bits may be stored in spare areas of the nonvolatile memory devices 3231 to 323*n*. The ECC unit 3213 is configured to detect an error of data read from the nonvolatile memory devices 3231 to 323*n*. When the detected error falls within a correction range, the ECC unit 3213 may correct the detected error.

The CPU 3214 is configured to analyze and process a signal SGL inputted from the host 3100. The CPU 3214 controls overall operations of the SSD controller 3210 in response to a request by the host 3100. The CPU 3214 controls the operations of the buffer memory device 3220 and the nonvolatile memory devices 3231 to 323*n* according to firmware for driving the SSD 3200. The RAM 3215 is used as a working memory device for driving the firmware.

FIG. 11 is a block diagram illustrating a computer system in which a data storage device including the nonvolatile memory device according to an embodiment of the present invention is mounted. Referring to FIG. 11, the computer system 4000 includes a network adapter 4100, a CPU 4200, a data storage device 4300, a RAM 4400, a ROM 4500, and a user interface 4600, which are electrically connected to the system bus 4700. Here, the data storage device 4300 may include the data storage device 1200 illustrated in FIG. 6 or the SSD 3200 illustrated in FIG. 9.

The network adapter 4100 is configured to provide an interface between the computer system 4000 and external networks. The CPU 4200 is configured to perform overall arithmetic operations for driving an operating system or application programs contained in the RAM 4400.

The data storage device 4300 is configured to store overall data required by the computer system 4000. For example, the operating system for driving the computer system 4000, application programs, various program modules, program data, and user data may be stored in the data storage device 4300.

The RAM 4400 may be used as a working memory device of the computer system 4000. During booting, the operating system, application programs, various program modules, which are read from the data storage device 4300, and program data required for driving the programs are loaded into the RAM 4400. The ROM 4500 stores a basic input/output system (BIOS) which is enabled before the operating system is driven. Through the user interface 4600, information exchange is performed between the computer system 4000 and a user.

Although not illustrated in the drawing, the computer system 4000 may further include a battery, application chipsets, a camera image processor (CIP) and the like.

According to embodiment of the present invention, it is possible to reduce a current or time required for a program operation of the nonvolatile memory device.

While certain embodiments have been described above, it will be understood to those skilled in the art that the embodiments described are by way of example only. Accordingly, the nonvolatile memory device described herein should not be limited based on the described embodiments. Rather, the nonvolatile memory device described herein should only be limited in light of the claims that follow when taken in conjunction with the above description and accompanying drawings.

What is claimed is:

1. A nonvolatile memory device comprising:
   a plurality of memory cells arranged in a region where word lines and bit lines intersect;
   a data read/write circuit comprising a plurality of latches configured to temporarily store data inputted from an external device, and configured to perform a program operation on the memory cells based on data stored in the latches; and
   a skip data control unit configured to determine whether or not data corresponding to each of the memory cells is inputted, to determine a memory cell as a skip memory cell when data corresponding to the memory cell is determined not to be inputted, and to store program-inhibit data in a latch corresponding to the skip memory cell.

2. The nonvolatile memory device according to claim 1, wherein the skip data control unit comprises a control block configured to refer to column addresses provided when data is inputted to the latches to determine whether or not the data corresponding to the each of the memory cells is inputted.

3. The nonvolatile memory device according to claim 2, wherein the control block is configured to count the toggle number of a write control signal provided when data is inputted to the latches.

4. The nonvolatile memory device according to claim 3, wherein the control block is configured to determine an end column address by adding the counted toggle number of the write control signal to a start column address provided when the data is inputted to the latches, and determine an address, which is not included in a range from the start column address to the end column address, as an address of the skip memory cell.

5. The nonvolatile memory device according to claim 2, wherein the skip data control unit further comprises an address storing block, and
   the control block is further configured to store an address of the skip memory cell in the address storing block.

6. The nonvolatile memory device according to claim 5, wherein the control block is configured to generate a control signal for accessing the latch corresponding to the skip memory cell, by referring to the address stored in the address storing block.

7. The nonvolatile memory device according to claim 6, wherein when the control signal is activated, a data line pair is electrically connected to the latch corresponding to the skip memory cell.

8. The nonvolatile memory device according to claim 7, wherein the skip memory cell is program-inhibited according to program-inhibit data provided through any one of the data line pair.

9. A data storage device comprising:
   a nonvolatile memory device; and
   a controller configured to control the nonvolatile memory device,
   wherein the nonvolatile memory device comprises:
   a plurality of memory cells arranged in a region where word lines and bit lines intersect;
   a data read/write circuit comprising a plurality of latches configured to store data inputted from an external device, and configured to perform a program operation on the memory cells based on data stored in the latches; and
   a skip data control unit configured to determine whether or not data corresponding to each of the memory cells exists, to determine a memory cell as a skip memory cell when data corresponding to the memory cell is determined not to exist, and to store program-inhibit data in a latch corresponding to the skip memory cell.

10. The data storage device according to claim 9, wherein the skip data control unit comprises a control block configured to refer to column addresses provided when data is inputted to the latches to determine whether or not the data corresponding to the each of the memory cells is inputted.

11. The nonvolatile memory device according to claim 10, wherein the control block is configured to count the toggle number of a write control signal provided when data is inputted to the latches.

12. The nonvolatile memory device according to claim 11, wherein the control block is configured to determine an end column address by adding the counted toggle number of the write control signal to a start column address provided when the data is inputted to the latches, and determine an address, which is not included in a range from the start column address to the end column address, as an address of the skip memory cell.

13. The nonvolatile memory device according to claim 10, wherein the skip data control unit further comprises an address storing block, and the control block is further configured to store an address of the skip memory cell in the address storing block.

14. The nonvolatile memory device according to claim 13, wherein the control block is configured to generate a control signal for accessing the latch corresponding to the skip memory cell, by referring to the address stored in the address storing block.

15. The nonvolatile memory device according to claim 14, wherein when the control signal is activated, a data line pair is electrically connected to the latch corresponding to the skip memory cell.

16. The nonvolatile memory device according to claim 15, wherein the skip memory cell is program-inhibited according to program-inhibit data provided through any one of the data line pair.

17. The nonvolatile memory device according to claim 9, wherein the nonvolatile memory device and the controller is configured as a memory card.

18. The nonvolatile memory device according to claim 9, wherein the nonvolatile memory device and the controller are configured to as a solid state drive (SSD).

19. The nonvolatile memory device according to claim 9, wherein the nonvolatile memory device and the controller are configured to be mounted in various types of packages.

* * * * *